United States Patent [19]

Holonyak, Jr.

[11] Patent Number: 4,639,275

[45] Date of Patent: Jan. 27, 1987

[54] FORMING DISORDERED LAYER BY CONTROLLED DIFFUSION IN HETEROJUNCTION III-V SEMICONDUCTOR

[75] Inventor: Nick Holonyak, Jr., Urbana, Ill.

[73] Assignee: The Board of Trustees of The University of Illinois, Urbana, Ill.

[21] Appl. No.: 646,739

[22] Filed: Aug. 31, 1984

Related U.S. Application Data

[63] Continuation-in-part of Ser. No. 370,756, Apr. 22, 1982, Pat. No. 4,511,408.

[51] Int. Cl.$^4$ ............... H01L 21/263; H01L 21/265
[52] U.S. Cl. ............................. 148/1.5; 29/571;
 29/576 B; 29/576 T; 148/175; 148/187;
 148/DIG. 84; 357/61; 357/91; 372/46
[58] Field of Search ............ 148/1.5, 187, 175;
 29/576 B, 576 T, 571; 357/91, 17, 61; 372/46

[56] References Cited

U.S. PATENT DOCUMENTS

| | | | |
|---|---|---|---|
| 4,377,030 | 3/1983 | Pettenpaul et al. | 29/576 B |
| 4,378,255 | 3/1983 | Holonyak, Jr. et al. | 148/1.5 |
| 4,438,446 | 3/1984 | Tsang | 357/17 |
| 4,489,480 | 12/1984 | Martin et al. | 29/576 B |
| 4,511,408 | 4/1985 | Holonyak, Jr. | 148/1.5 |

FOREIGN PATENT DOCUMENTS

| | | | |
|---|---|---|---|
| 0036175 | 4/1981 | Japan | 29/569 L |
| 0083085 | 7/1981 | Japan | 29/569 L |
| 8203946 | 11/1982 | PCT Int'l Appl. | |

OTHER PUBLICATIONS

Greiner et al, Appl. Phys. Letts. 44, (1984), 750.
Van Vechten, Jour. Appl. Phys. 53, (1982), 7082.
Petroff et al, Appl. Phys. Letts. 23, (1973), 469.
Camras et al, Jour. Appl. Phys. 54, (1983), 5637.
Meehan et al, Appl. Phys. Letts. 44, (1984), 428, 700.
Meehan et al, Jour. Appl. Phys. 55, (1984), 2672.
Laidig et al, Jour. Electronics Materials, 11 (1982), pp. 1-20.
Coleman et al, Appl. Phys. Letts. 40, (1982), 904.
Camras et al, Appl. Phys. Letts. 42, (1983), 185.
Camras et al in Conf. on GeAs and Related Compds; Inst. Phys. Conf. Ser. 65, London, 1983, p. 233.
Laidig et al, Solid St. Comm. 38, (1981), 301.
Holonyak, Jr. et al, Appl. Phys. Letts. 39, (1981), 102.
Laidig et al, Appl. Phys. Letts. 38, (1981), 776.
Kirchoefer et al, Jour. Appl. Phys. 53, (1982), 766.
Fisher et al, Appl. Phys. Letts. 44, (1984), 1.
Meehan et al. J. Appl. Phys. 54, (Dec. 1983), 7190.
Laidig et al, J. Appl. Phys. 54, (Nov. 1983), 6382.
Kawata et al, Jap. Jour. Appl. Phys. 21, (1982), L-431.

Primary Examiner—Upendra Roy
Attorney, Agent, or Firm—Martin Novack

[57] ABSTRACT

A method is disclosed for converting a multilayer semiconductor structure, that includes active semiconductor regions interposed between semiconductor barrier layers, into a disordered alloy by introduction of a specified disordering element into the multilayer structure. Devices made using the method are also disclosed.

23 Claims, 12 Drawing Figures

FORMING DISORDERED LAYER BY CONTROLLED DIFFUSION IN HETEROJUNCTION III-V SEMICONDUCTOR

This is a continuation-in-part of U.S. application Ser. No. 370,756 filed Apr. 22, 1982, now U.S. Pat. No. 4,511,408.

BACKGROUND OF THE INVENTION

This invention relates to improvements in semiconductive devices, and more particularly to a method for producing integrated light emitting semiconductor devices. The United States Government has rights in this invention as a result of financial support under NSF grants.

Light emitting semiconductors are well known in the prior art. One of the more widely used light emitting devices is a heterojunction light emitter fabricated, for example, using a gallium arsenide/aluminum gallium arsenide material system. In such devices, a pair of relatively wide band gap layers (aluminum gallium arsenide) of opposite conductivity type are sandwiched around an active region (gallium arsenide). The interfaces between the active region and the wide band gap layers form a pair of heterojunctions. These heterojunctions effectively provide both carrier and optical confinement. The devices are generally used as light emitting diodes or lasers and may be energized using an electrical current or by optical pumping.

An improved light emitting device is described in my U.S. Pat. No. 4,439,782, assigned to the same assignee as this application. Therein is described a light emitting device wherein the active region comprises one or more layers of gallium arsenide separated by aluminum arsenide barrier layers. The aluminum arsenide binary layers replace previously employed aluminum gallium arsenide ternary barrier layers for the reason that the latter ternary layers have been found to be inherently disordered and to exhibit alloy clustering in the regions adjacent to the gallium arsenide/aluminum gallium arsenide interface. That clustering leads to the device requiring larger threshold currents and exhibiting lower efficiencies. The disclosure and teachings of the aforementioned patent application are incorporated herein by reference.

Light emitting devices such as those described above are generally, although not necessarily, grown by metal-organic chemical vapor deposition ("MO-CVD"), which is described, for example, in a publication entitled "Chemical Vapor Deposition for New Material Applications", appearing in the June, 1978, issue of "Electronic Packaging and Production". Such devices are also grown by molecular beam epitaxy, liquid phase epitaxy, or other suitable deposition techniques. The MO-CVD and MBE processes are generally the preferred ones.

In the aforementioned processes, the light emitting devices are produced in wafer form, which wafer is then cleaved or cut to produce individual light-emitting diodes or lasers. This is in contrast to the well-known integrated circuit technology wherein large numbers of active devices are constructed and interconnected on a single chip. Such integration, heretofore, has been unavailable, on a practical basis, for the above-mentioned light emitting-semiconductor devices. Attempts to integrate light emitting devices have generally been rather crude--involving the actual physical emplacement of light-emitting structures in etched-out substrates. Such a structure is shown in U.S. Pat. No. 4,165,474 to D. J. Myers.

It is clear that an economic method of integrating heterojunction light emitting devices into larger scale integrated circuits would be an important contribution to the expansion of optical data processing and data communications.

Accordingly, it is among the objects of this invention to provide a method which enables the integration of III-V compound heterojunction devices into an overall integrated structure.

It is a further object of this invention to provide a method for constructing integrated optoelectronic and field effect devices which method is not unduly complex, fits with present semiconductor processing technology, and allows fabrication of complementary N and P types of devices.

SUMMARY OF THE INVENTION

In accordance with the above objects, III-V semiconductive structure are disordered and shifted up in energy gap, while maintaining the crystalline structure, by introduction of a disordering element. In U.S. Pat. No. 4,378,255 of N. Holonyak and W. Laidig, it is disclosed that such disordering can be achieved by diffusion of zinc atoms. For example, all or selected portions of a multilayer of either gallium arsenide/aluminum arsenide or gallium arsenide/ aluminum gallium arsenide can be converted into single crystal aluminum gallium arsenide having a higher energy gap than that of the original structure by the process of a zinc diffusion (as disclosed in the above referenced patent) or by introduction of silicon or krypton or zinc, such as by ion implantation thereof. Other active devices can then be constructed in the higher energy gap material using established semiconductor processing steps.

In accordance with a further improvement hereof, disordering is implemented by diffusion of a disordering element which serves as a donor (n dopant), this process being complementary with the above-described acceptor-diffusion disordering process (e.g. zinc p dopant), thereby facilitating, inter alia, fabrication of complementary devices in an integrated circuit. Silicon, germanium or tin impurities, which are amphoteric but serve here as donors, are diffused into the structure e.g. superlattice or single quantum well) at temperatures which permit selective disordering, preferably in the range between about 700° C. and 850° C. It has been shown that silicon and germanium can be successfully diffused, using an encapsulant, into gallium arsenide using rapid thermal processing at temperatures 850° to 1050° C. [See M. E. Greiner and J. F. Gibbons, Appl. Phys. Lett. 44, 750 (1984).] In the present invention, where the diffused element is used for selective disordering, lower temperature, preferably in the range 700° C. to 850° C., is used so that uncontrolled thermal disordering, beyond the region into which the disordering element is diffused, will not substantially occur.

Further features and advantages of the invention will become more readily apparent from the following detailed description, when taken in conjunction with the accompanying drawings.

DESCRIPTION OF THE PREFERRED EMBODIMENTS

Figure 1:
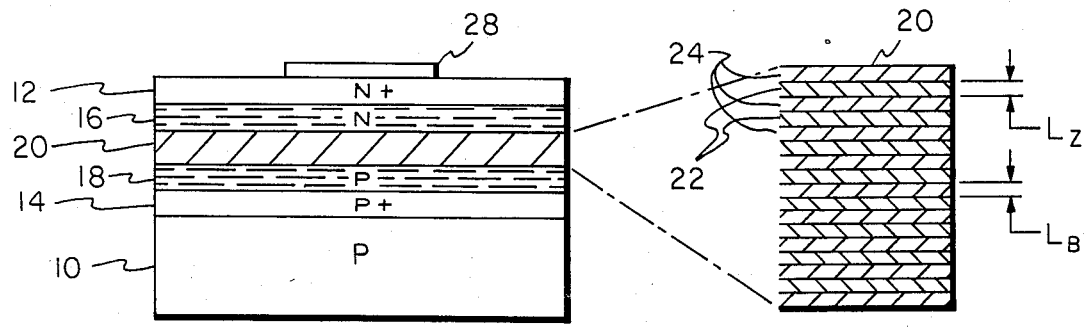
FIG. 1 is a section view of a superlattice heterostructure.

Referring now to FIG. 1, there is shown a semiconductor heterostructure device of the type described in U.S. Pat. No. 4,439,782. The entire device is constructed on a gallium arsenide semi-insulating or conducting substrate 10. A pair of outer buffer or contact layers 12 and 14 encompass a pair of injecting/collecting (i.e., injecting or collecting) regions 16 and 18 which are preferably, although not necessarily, of opposite conductivity type. A superlattice (many-layer) structure 20 is encompassed between regions 16 and 18 which structure is shown in a blown-up view to the right of the device. Superlattice 20 comprises a plurality of interleaved lower gap active regions 22 sandwiched between higher gap barrier layers 24.

The injecting/collecting confining regions 16 and 18 are of a relatively wide band gap semiconductor material and active layers 22 are of a relatively narrow band gap binary semiconductor material. Barrier layers 24 are of a binary semiconductor material that is lattice-matched to the active layer material 22. While not the most preferred embodiment, barrier layers 24 can also be a ternary semiconductor material which is lattice-matched to the binary active material 22.

In superlattice 20, each active layer 22 is a quantum-well having a thickness in the range of about 20 to 500 Angstroms, with the preferred thickness range being 20 to 200 Angstroms. Each barrier region 24 should have a thickness of at least about 10 Angstroms and preferably be in the range of between about 10 and 200 Angstroms. The number of active layers 22 is essentially subject to choice, but generally is in the range of 4 to 100 layers with the number of barrier regions 24 being one more in number. However, as noted herein, the invention also has applicability to disordering of a single quantum well active region that is adjacent a barrier region.

An embodiment of the structure of FIG. 1 is as follows:

layer 12: 1 μm GaAs: Se (n $\sim 1 \times 10^{18}$ cm$^{-3}$)

layer 16: 0.5-2.0 μm Al$_{0.4}$Ga$_{0.6}$ As: Se (n$\sim 5 \times 10^{17}$ cm$^{-3}$)

layers 24: (thickness=L$_B$) AlAs (doped or undoped)

layers 22: (thickness=L$_z$) GaAs (doped or undoped)

layer 18: 0.5-2.0 μm Al$_{0.4}$Ga$_{0.6}$ As: Zn(p$\sim 2 \times 10^{17}$ cm$^{-3}$)

layer 14: 1 μm GaAs: Zn (p$\sim 2 \times 10^{18}$ cm$^{-3}$)

The diffusion of zinc atoms into superlattice 20 can cause the superlattice to become compositionally disordered Al$_x$Ga$_{1-x}$As, with its energy gap (in one specific case) changed from about E$_g$=1.61 eV (for the gallium arsenide active layer 22) to about E$_g$=2.08 eV. (From dull red to yellow).

In order to accomplish the zinc diffusion only in desired areas, a silicon nitride mask 28 is laid down on the surface of layer 12 using well-known photolithographic processes. The exposed portions of contact region 12 are etched away, exposing the upper surface of confining layer 16. The semiconductor structure along with ZnAs$_2$ is then placed in a quartz ampoule and the combination is placed in a diffusion oven. Zinc is introduced by diffusion in the crystal in the temperature range of 500°-600° C., a temperature well below the normal cross diffusion temperature of the superlattice components. The diffusion time is, of course, dependent upon the device structure, but diffusion times ranging from 10 to 60 minutes are appropriate.

The zinc atoms diffuse into the exposed regions and cause active regions 22 and barrier regions 24 in superlattice 20 to become compositionally disordered alloy Al$_x$Ga$_{1-x}$As. In other words, the various thin superlattice layers are combined in such a manner as to lose their individual identities, while maintaining the crystalline structure. If barrier regions 24 are AlAs and active regions 22 are GaAs, x~L$_B$/(L$_B$+L$_z$). If the barrier regions 24 are Al$_y$Ga$_{1-y}$As, then x~yL$_B$/(L$_B$+L$_z$). In this instance, y represents the fraction of barrier layer 24 that can be considered as AlAs.

Ordinarily, aluminum/gallium interdiffusion in the temperature range 500°-600° C. is negligible. It has been shown, however, that when zinc is diffused, even at such a low temperature, into AlAs/GaAs superlattices, the zinc enhances the aluminum/gallium interdiffusion. Thus, at a low temperature, and in any pattern desired, the GaAs/AlAs or GaAs/Al$_x$Ga$_{1-x}$As superlattice can be fully disordered and, depending upon the GaAs layer's thickness L$_z$ and the L$_z$/L$_B$ ratio, can be increased in energy gap or even shifted, from direct gap to indirect gap.

In a form of the invention, it has been found that introduction of silicon or krypton, such as by ion implantation, can also cause the superlattice to become compositionally disordered, while maintaining the crystalline structure. In one example, the AlAs-GaAs superlattice, grown by metalorganic vapor deposition, had alternating undoped layers of GaAs (86 Angstroms) and AlAs (80 Angstroms), with 126 layers altogether for a total thickness of 1 μm. Silicon ions were implanted into the superlattice structures at room temperature at 375 keV at an angle of 7° with respect to the substrate. The ion dose was 10$^{14}$ cm$^{-2}$. Some samples were subsequently annealed at 675° C. for 4 hours in an arsenicrich atmosphere. Compositional disordering was found to result, with the energy gap, in an annealed case, for the disordered region being about Eg=1.99 eV, and therefore substantially higher than was exhibited by the ordered superlattice, which was about Eg=1.57 eV. Annealing, preferably in a temperature range of about 500° C. to 700° C., and below the temperature at which the superlattice was originally grown, appears to be an important aspect of the process in these examples. For an implanted dose of $10^{14}$ cm$^{-2}$ it appears that, before anneal, compositional disordering has not occurred and considerable crystal damage is present. After anneal at temperatures less than the original growth temperature, the damage in the implanted region is removed and compositional disordering is extensive, though not complete.

In other examples, zinc and krypton ions were implanted under similar conditions, and resulted in observable compositional disordering after annealing, although the results for the same dosages exhibited less disordering than was the case with silicon implantation.

Figure 2:
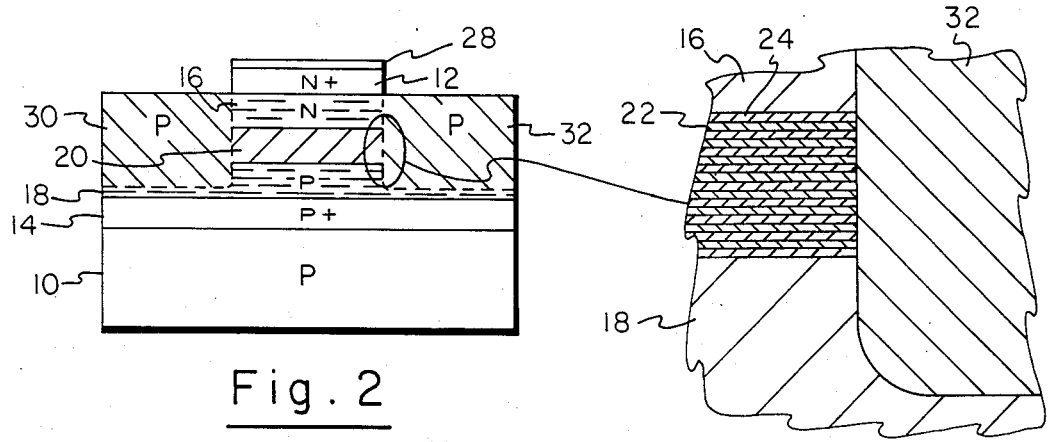
FIG. 2 is the structure of FIG. 1 after selective disordering and additional processing.
Figure 3:
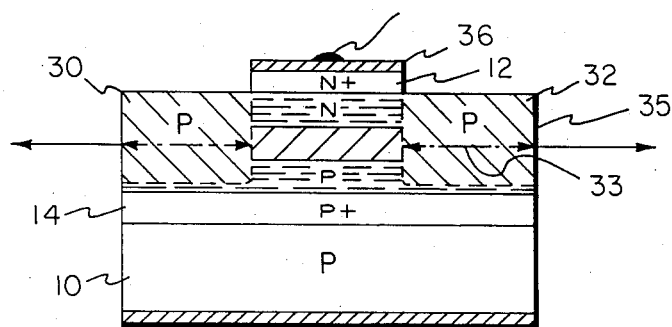
FIG. 3 is the structure of FIG. 2 after electrical contacts have been emplaced.
Figure 4:
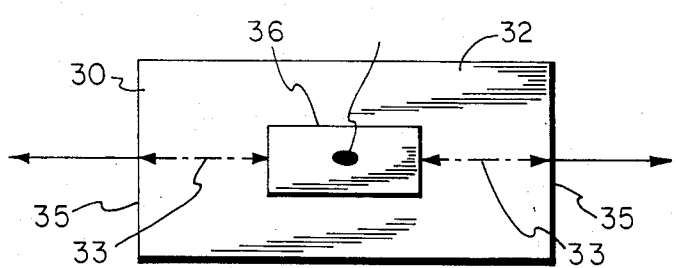
FIG. 4 is a plan view of the light emitting device of FIG. 3.

FIG. 2 shows the structure of FIG. 1 after introduction of the disordering element, and in FIG. 3 the silicon nitride layer 28 has been removed and replaced by metallization layer 36. A similar layer of metallization has been applied to the underside of substrate 10 (substrate 10 being conductive in this instance) enabling a light emitting structure to be completed. A plan view of the structure is shown in FIG. 4.

When a potential is applied via contact 36 to the heterojunction laser (or if there are no contacts, the device is optically pumped), a red light is emitted by the GaAs active layers 22 along the long dimension as shown by arrows 33. Since the $Al_xGa_{1-x}As$ regions 30 and 32, into which the disordering element was introduced, are of a higher energy gap (orange or yellow) than the GaAs regions 22, the red light is able to pass therethrough without hindrance. Wafer edges 35 act as Fabry-Perot reflectors, creating a cavity of nonabsorbing $Al_xGa_{1-x}As$ for the laser. Obviously, the structure of the cavity for the heterojunction laser can be designed as desired for optimum performance characteristics. For instance, a larger cavity will provide longer photon transit times, less cavity end loss, a higher Q and a resultant lower threshold laser.

A plurality of light emitting devices such as those above described have been grown on a single substrate and then subsequently isolated by selective introduction of a disordering element, as described, to create individual devices in a monolithic environment. When a zinc diffusion or implantation is used, it creates a p region which is substantially semiconductive in its own right. By subsequently bombarding the exposed p regions with a suitable source of protons, those regions can be sufficiently damaged while still remaining single crystalline so as to create high resistivity isolating barriers between the active devices. Such bombardment does not effect the red light transmissivity of the bombarded regions.

Superlattices having active regions 22 (i.e., GaAs) as thick as 500 Angstroms ($L_z$) can be compositionally disordered as taught herein. Preferably, however, the thickness of active region 22 should be approximately 200 Angstroms or less for optimum results and, in any event, be sufficiently thin to exhibit quantum size effects.

Figure 5:
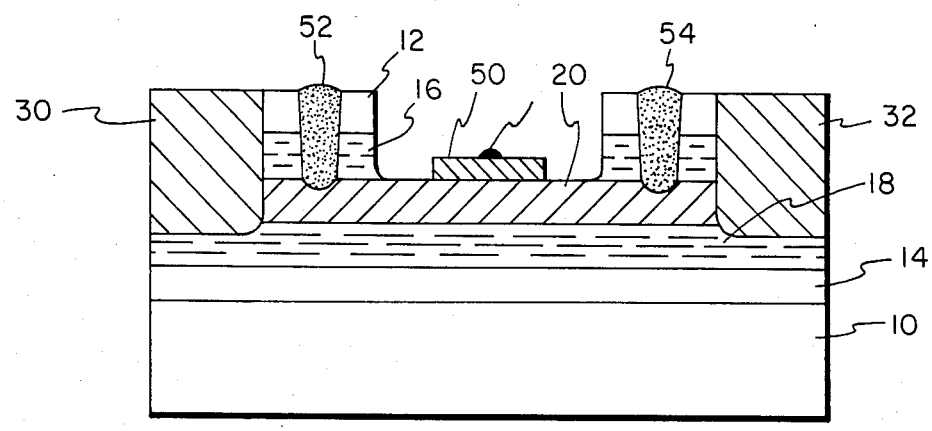
FIG. 5 is a field effect transistor constructed in accordance with the invention.

Referring now to FIG. 5, there is shown a sectional view of a Schottky barrier field effect transistor constructed employing the heterostructure configuration of FIG. 1 and isolated from other portions of the circuitry by the disordering process described above. In this instance, regions 12 and 16 have been etched away to open a channel which exposes superlattice layer 20. Metallization contact 50 has been deposited and is used as the gate electrode. N type metallizations 52 and 54 are alloyed into layers 12 and 16 and contact superlattice layer 20. These provide the source and drain contacts for the device. The device of FIG. 5 is illustrated to show the versatility of the selective disordering technique hereof in that a plurality of devices can be integrated into a single monolithic chip and then isolated by the higher gap disordered regions—which are later converted to higher resistivity, if necessary, by proton bombardment. Obviously, additional active devices can be constructed in the disordered regions, if such are desired.

The method of constructing the Schottky barrier device shown in FIG. 5 is conventional in that layer 20 can be high mobility modulation doped, i.e., a donor grown into the barriers but none in the adjacent regions (i.e., GaAs). Layers 12 and 16 are selectively etched away after the upper surface of the device is suitably masked. The last step involves the alloying of junction contact 52 and 54, again after suitable masking.

Figure 6:
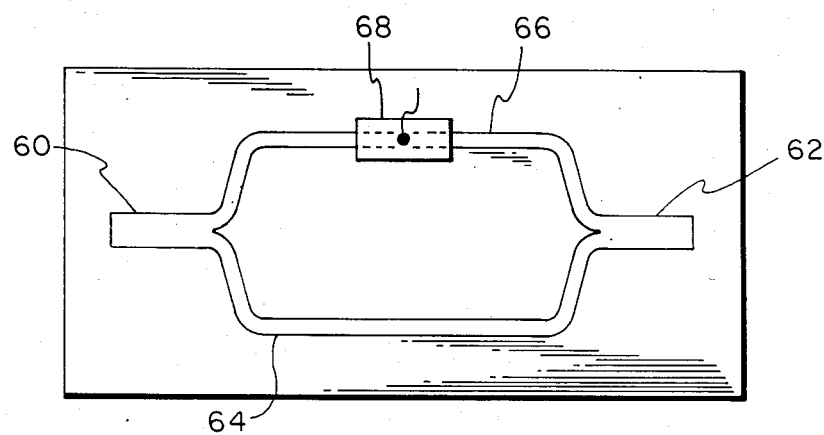
FIG. 6 is a plan view of an integrated optical processing device.

Referring now to FIG. 6, there is shown a plan view of an integrated structure constructed in accordance with the invention. In this instance, however, contact layer 12 and confining layer 16 over the superlattice layer have been removed to show an integrated laser/waveguide structure. Laser active regions 60 and 62 are constructed identically to that shown in FIGS. 2-3, except that each terminates in a pair of superlattice waveguides 64 and 66. A metal contact 68 (similar to that shown in FIG. 5) overlays waveguide 66 and is reverse (or even forward) biased to provide a Schottky barrier junction between itself and underlying superlattice 66. The individual devices have been isolated by selective disordering as described above.

Laser 60 is biased in such a mode as to generate light; however, laser 62 is biased sufficiently below threshold that it can be optically pumped by in-phase radiation traveling along superlattice waveguides 64 and 66. Due to fact that the lower gap material (red) exhibits a higher index of refraction than the yellow material, the emitted red light tends to stay within the lower gap material making up waveguides 64 and 66 (so long as there are no abrupt changes of direction of the waveguide materials). By properly energizing contact 68, a retarding electro-optic effect can be achieved which will alter the phase of the signal on waveguide 66 so as to create an out-of-phase signal at the juncture feeding laser 62. Under these conditions, laser 62 is inhibited from lasing. If contact 68 is not energized, in phase optical pumping enables laser 62 to lase, thereby providing an electro-optic logic device.

Figure 7:
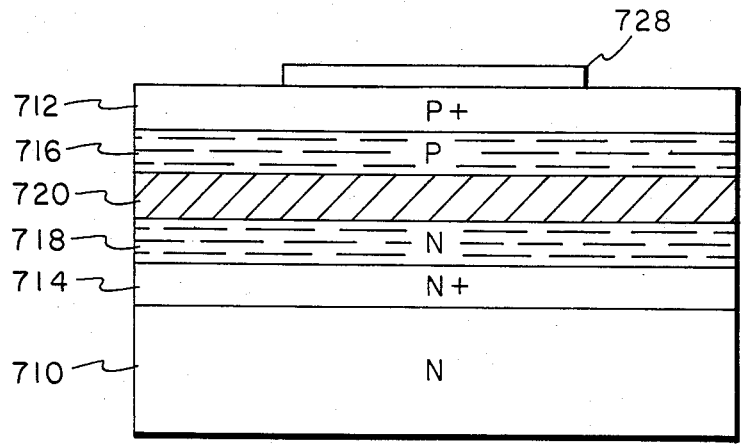
FIG. 7 is a section view of a superlattice heterostructure as in FIG. 1, but with opposite conductivity type semiconductor materials.

Referring to FIG. 7, there is shown a semiconductor heterostructure device as shown in FIG. 1, but with the N-type and P-type layers being of opposite conductivity type; i.e., with layers 712 and 716 being P+ and P type layers, respectively, and with layers 710, 714 and 718 being N, N+ and N type layers, respectively. The superlattice 720 includes active layers and barrier regions, as in FIG. 1. The materials, thicknesses and doping levels may be, for example, substantially the same as those indicated for corresponding layers of the FIG. 1 structure, but with the layer dopants being reversed; i.e., Se for layers 714 and 718 and Zn for layers 712 and 716. In this case, the diffusion of silicon, germanium or tin atoms into the superlattice 720 causes the superlattice to be compositionally disordered. As in the FIG. 1 example, a silicon nitride mask can be employed in a photolithographic process such that the exposed portions of the contact region 712 are etched away, exposing the upper surface of confining layer 716. A layer of silicon germanium or tin to be diffused is then evaporated on the structure and an encapsulating layer such as silicon dioxide is deposited over the silicon. Diffusion of the disordering element into the layer structure is then implemented at a temperature, preferably in the range 700° to 850° C. As noted above, diffusion time is dependent upon the device structure, a diffusion time in the range of 1 to 24 or more hours generally being appropriate. The energy gap changes in the superlattice will be similar to the case for zinc diffusion, as described above.

Figure 8:
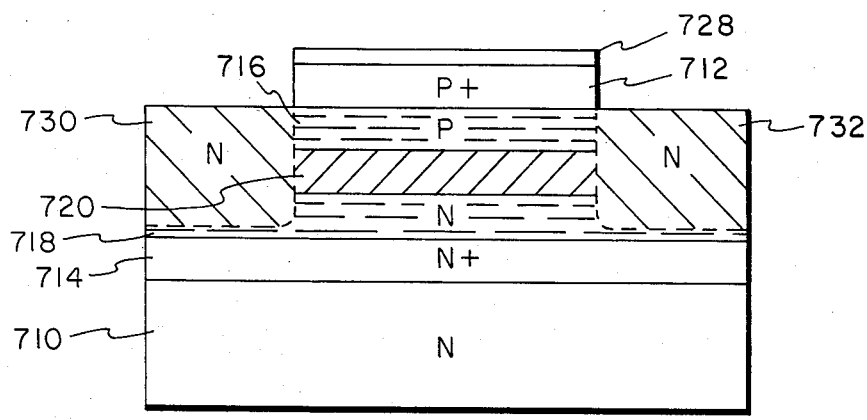
FIG. 8 is the structure of FIG. 7 after selective disordering and additional processing.
Figure 9:
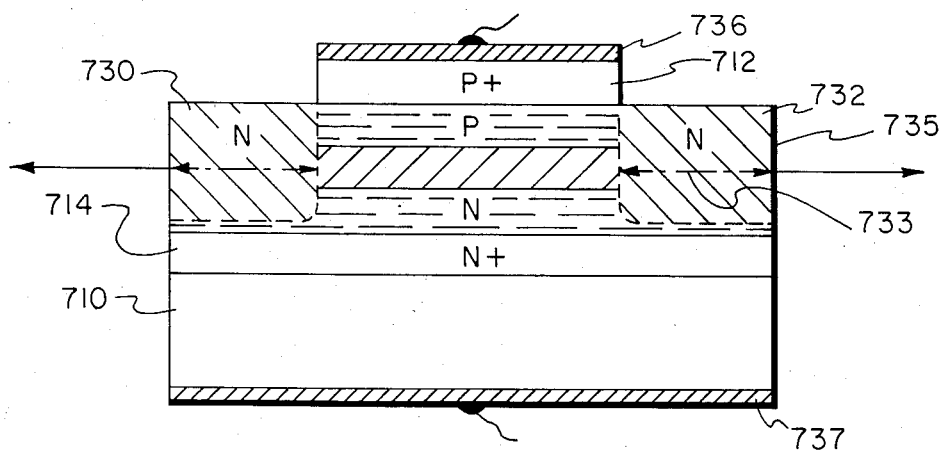
FIG. 9 is the structure of FIG. 8 after electrical contacts have been emplaced.

FIG. 8 shows the structure of FIG. 7 after the selective disordering has been implemented and the encapsulating layer has been etched away. The regions 730 and 732, into which the silicon, germanium or tin has been diffused, are rendered N-type in this case. As in FIG. 3, metallization layers 736 and 737 can be applied (or optical pumping can be used) to obtain a light emitting device, as previously described. Again, a plurality of devices can be grown in a single substrate and isolated, and/or complementary devices can be made using both donor and acceptor diffusion processes as described herein. Further, it will be understood that field effect transistors, such as shown in FIGS. 5 and 6 can be constructed using the described donor and/or acceptor disordering and, again, complementary devices can be made using both processes. Also, active regions with a single quantum well and barrier layer interface can be disordered using the described processes.

An experiment will now be described wherein an aluminum gallium arsenide - gallium arsenide superlattice is selectively disordered using silicon diffusion. Initially a 1 $\mu$m layer of $Al_xGa_{1-x}As$ ($x \sim 0.6$) is grown on a substrate followed by a $\sim 0.4$ $\mu$m GaAs layer and then the superlattice. The layers are grown by metalorganic vapor deposition. The superlattice consisted of 40 periods of GaAs quantum wells of thickness $L_z \approx 280$ Angstroms coupled by $Al_xGa_{1-x}As$ ($x \sim 0.6$) barriers of thickness $L_B \approx 320$ Angstroms. A bright-field transmission electron micrograph (TEM) of a section of the superlattice is shown on the right side of FIG. 10. (The diffused region on the left is described later.)

Prior to Si diffusion into the superlattice, $Si_3N_4$ is deposited (for diffusion masking) on the wafer, and for convenience a stripe pattern (15 $\mu$m stripes on a 25 $\mu$m period, FIG. 11) is developed on photoresist deposited on the $Si_3N_4$. The $Si_3N_4$ is then plasma etched ($CF_4$) leaving 10 $\mu$m bare stripes on the wafer. Next the photoresist is removed, and the wafer is cleaned in HCl just before $\sim 100$Å of Si is electron-beam evaporated onto the wafer at $7 \times 10^{-7}$ Torr. Immediately after the evaporation is completed $\sim 0.5$ $\mu$m of $SiO_2$ is deposited onto the wafer. The superlattice, with a small piece of As, is then sealed in a quartz ampoule facedown on a "slab" of Si to insure a uniform temperature across the wafer (with also an overpressure of As). After the diffusion, which is accomplished in one example at 850° C. for 10 hr, most of the $SiO_2$ is removed with $NH_4F$:HF (7:1, 3.5 min). The remaining $SiO_2$, Si, and $Si_3N_4$ are removed in a $CF_4$ plasma. The sample is then cleaved, with one part employed for TEM specimens and the other samples for photopumping.

Figure 10:
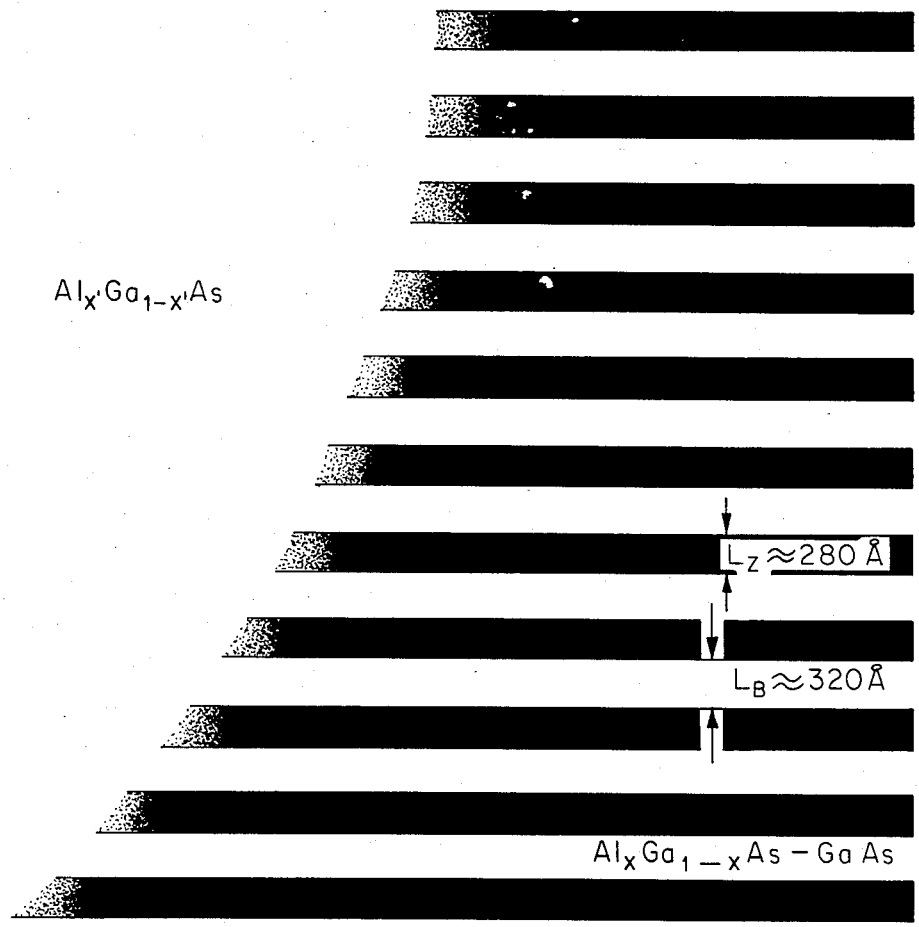
FIG. 10 is a transmission electron micrograph of a section of superlattice, a portion of which has been disordered with diffused silicon.

In FIG. 10 the region at the left is impuritydisordered bulk-crystal $Al_{x'}Ga_{1-x'}As$ ($0 < x' < x$). This region (and TEM image) is taken from the lower part of the superlattice near a $Si_3N_4$ mask edge, and is just the depth (2.4 $\mu$m) to which the Si impurity penetrates during the diffusion process. The TEM micrograph of FIG. 10 does not reveal any dislocations at the diffusion boundary with the undisturbed superlattice. Furthermore, at higher magnification (not shown) lattice fringe images can be resolved that extend undistorted from the as-grown superlattice into the disordered $Al_{x'}Ga_{1-x'}As$, which obviously is single crystal. It is noted that the 850° C.-10 hr anneal cycle has not caused any noticeable change in the as-grown superlattice (right side of FIG. 1). This was confirmed by separate TEM images of the as-grown (non-annealed) superlattice.

Figure 11:
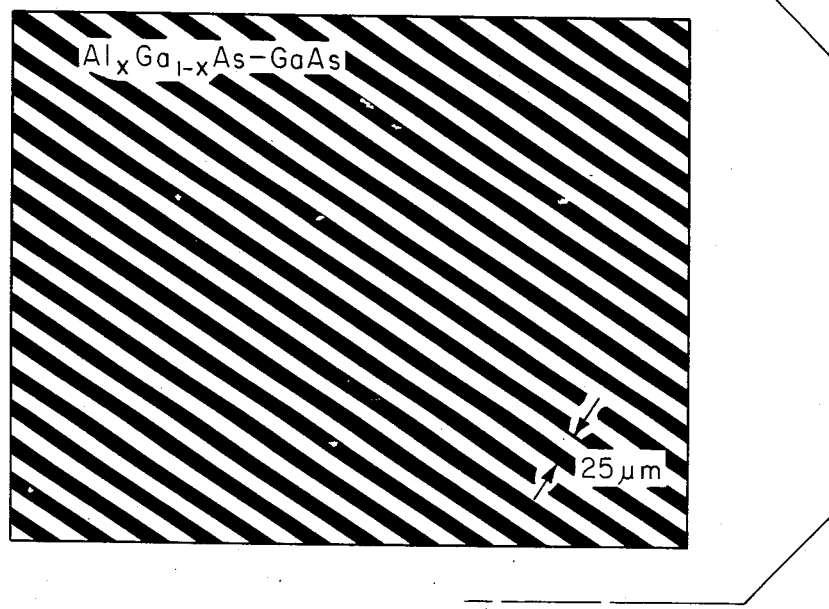
FIG. 11 shows the effect of selective disordering in an example hereof using diffused silicon.
Figure 12:
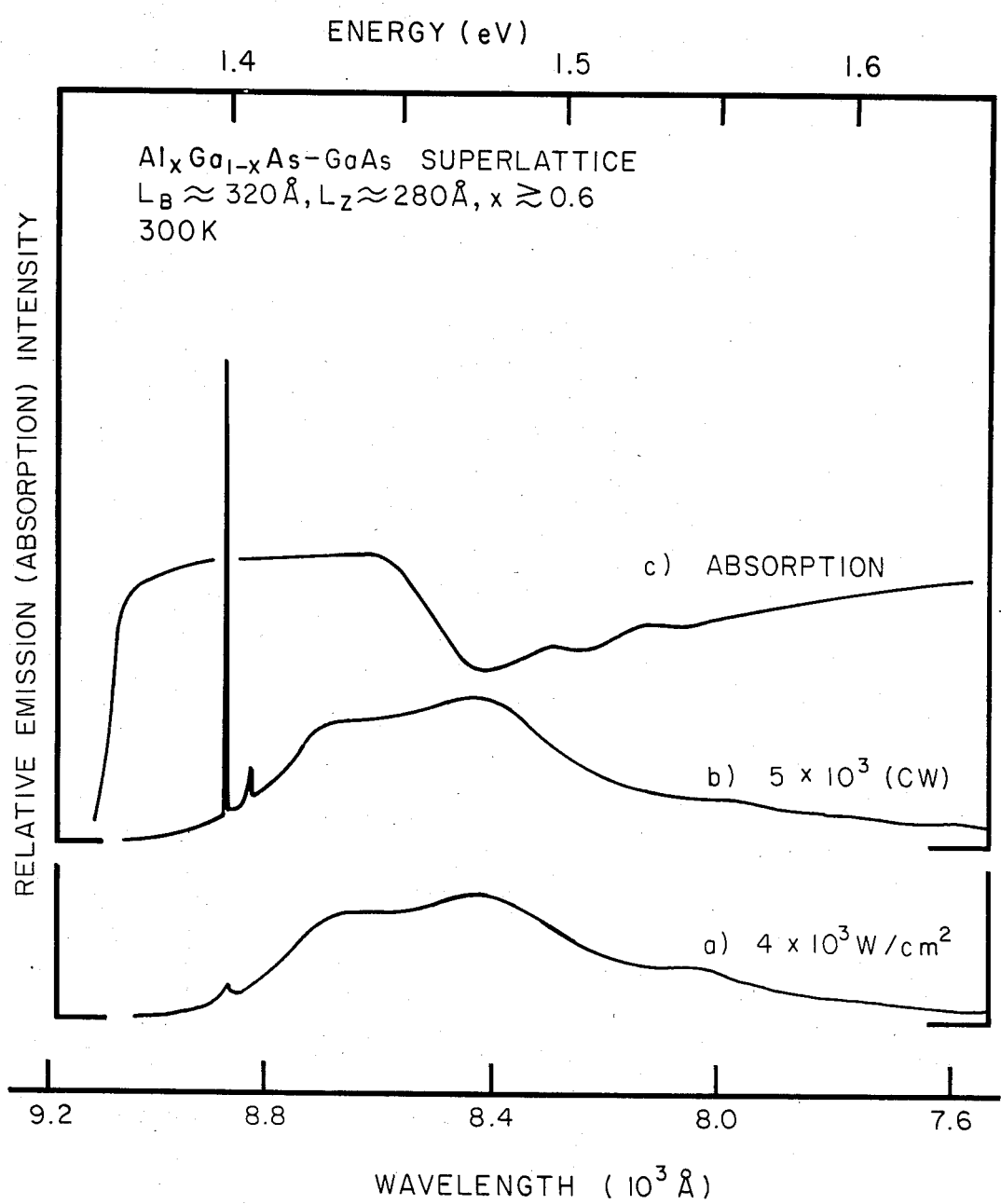
FIG. 12 shows curves of relative emission intensity or absorption vs. wavelength for an example hereof using diffused silicon.

FIG. 11 shows in a different manner the effect of the selective (stripe-pattern) disordering. To obtain this figure white light has been transmitted through a sample after the substrate and buffer $Al_xGa_{1-x}As$ and GaAs layers have been removed from the superlattice. The red stripes are the regions into which Si has been selectively diffused and creates disordered $Al_{x'}Ga_{1-x'}As$ of increased energy gap. Separately diffused samples without masking stripes have been examined in absorption and in photoluminescence. These measurements confirm that the "red" diffused region has, indeed, been shifted to higher gap ($x' \gtrsim 0.32$). Because of the combination of high gap and heavy doping of the Si-diffused ("red") region, photoluminescence signals are too weak to be recorded. The masked region, i.e., the "black" stripes of FIG. 11 or the corresponding superlattice region shown on the right in FIG. 10, operates as expected as a continuous (cw) 300 K photopumped laser. A portion of the stripe-pattern sample of FIG. 11 has been heat sunk under diamond and is shown in cw 300 K photopumped laser operation in FIG. 12. Curve (a) corresponds to laser threshold ($4 \times 10^3$ W/cm$^2$ or $J_{eq} \sim 1.7 \times 10^3$ A/cm$^2$), and (b) at $5 \times 10^3$ W/cm$^2$ ($J_{eq} \sim 2.1 \times 10^3$ A/cm$^2$) single mode operation is well established. These data show that the masked portion of the superlattice is not damaged by the thermal annealing cycle, that the adjacent higher gap "red" bulk $Al_{x'}Ga_{1-x'}As$ crystal (or the diffusion interface) does not draw the excess carriers into non-radiative recombination, and that the quality of the $\sim 80$ layer interfaces is high. It can be noted that the photopumping excitation beam, a 5145 Å Ar+laser, is not focused to much smaller than a 35 $\mu$m diameter spot and strikes not more than 10 $\mu$m of "as-grown" superlattice and photoexcites more of the red-gap impurity-disordered $Al_{x'}Ga_{1-x'}As$. It is clear that in this form of excitation "geometry" defects at the red-black diffusion boundary (FIG. 11), if present, would quench the laser operation.

The 2.4 $\mu$m disordering depth into the SL crystal (FIG. 10) indicates that, for thermal annealing at 850°C. for 10 hr (or much longer than the rapid anneals described by Greiner and Gibbons (referenced above) the effective Si diffusion constant is $D(SL) \sim 1.6 \times 10^{-12}$ cm$^2$/s, which is $\sim 2.7x$ greater than $D(GaAs) \sim 6 \times 10^{-13}$ cm$^2$/s, described by Greiner and Gibbons. This generally agrees with earlier observations that a disordering impurity (Zn acceptor) diffused into an $Al_xGa_{1-x}As$-GaAs SL has a significantly higher diffusion coefficient than in GaAs. Thus, to achieve practical diffusion depths of $\lesssim 1$ $\mu$m, the annealing times and temperatures of this example can be reduced. Applicant has observed that diffusion temperatures in the range 700° to 850° C. are preferred.

I claim:

1. A method for converting a multilayer semiconductor structure, which comprises first active semiconductor regions interposed between second semiconductor barrier layers, into a disordered alloy of both said first and second semiconductors, said alloy exhibiting a higher energy gap than said first active semiconductor region, the method comprising diffusing a disordering element, selected from the group consisting of silicon, germanium, and tin, into said multilayer structure said diffusing being performed at a temperature in the range between about 700° C. and 850° C.

2. The method as defined by claim 1, wherein said first active semiconductor regions are sufficiently thin to exhibit quantum size effects.

3. The method as defined by claim 1, wherein said first active semiconducting region is GaAs.

4. The method as defined by claim 1, wherein said second semiconductor barrier layer is $Al_xGa_{1-x}As$.

5. The method as defined by claim 1, wherein said disordering element is silicon.

6. The method as defined by claim 2, wherein the thickness of said first active semiconductor region is less than about 500 Angstroms.

7. The method as defined by claim 3, wherein said first active semiconducting region is GaAs.

8. The method as defined by claim 3, wherein said second semiconductor barrier layer is AlAs.

9. The method as defined by claim 6, wherein said first active semiconducting region is GaAs.

10. The method as defined by claim 7, wherein said second semiconductor barrier layer is AlAs.

11. The method as defined by claim 9, wherein said second semiconductor barrier layer is AlAs.

12. A method of integrating a semiconductor device into a monolithic structure, at least a portion of said device including a heterojunction multilayer structure, comprising the steps of:
constructing a heterojunction semiconductor device which includes first active semiconductor regions interposed between second semiconductor barrier layers;
masking portions of said device; and
diffusing a disordering element, selected from the group consisting of silicon, germanium, and tin into unmasked portions of said device to cause said active barrier regions to compositionally disorder to a higher energy gap material than said active semiconductor regions said diffusing being performed at a temperature in the range between about 700° C. and 850° C.

13. The method as defined by claim 12, wherein said first active semiconductor regions are sufficiently thin to exhibit quantum size effects.

14. The method as defined by claim 12, wherein said first active semiconducting region is GaAs.

15. The method as defined by claim 12, wherein second semiconductor barrier layer is AlAs.

16. The method as defined by claim 12, wherein said second semiconductor barrier layer is $Al_xGa_{1-x}As$.

17. The method as defined by claim 12, wherein said disordering element is silicon.

18. The method as defined by claim 13, wherein said first active semiconducting region is GaAs.

19. A method of making a semiconductor structure, comprising the steps of:
forming a semiconductor structure which includes a first active semiconductor region disposed on a second semiconductor barrier layer, said region being sufficiently thin to exhibit quantum size effects;
diffusing a disording element, selected from the group consisting of silicon, germanium, and tin, into said semiconductor structure to obtain a disordered alloy of both said first and second semiconductors, said alloy exhibiting a higher energy gap than said first active semiconductor region, said diffusing being performed at a temperature in the range between about 700° C. and 850° C.

20. The method as defined by claim 19, wherein said first active semiconductor regions are sufficiently thin to exhibit quantum size effects.

21. The method as defined by claim 19, wherein said first active semiconducting region is GaAs.

22. The method as defined by claim 19, wherein said disordering element is silicon.

23. The method as defined by claim 20, wherein said first active semiconducting region is GaAs.

* * * * *